(12) United States Patent
Santhanam et al.

(10) Patent No.: US 11,658,684 B2
(45) Date of Patent: May 23, 2023

(54) MULTI-PORT—MULTI MODE REED SOLOMON DECODER

(71) Applicant: Synopsys, Inc., Mountain View, CA (US)

(72) Inventors: Venugopal Santhanam, Karnataka (IN); Ketankumar Sheth, Karnataka (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/697,736

(22) Filed: Mar. 17, 2022

(65) Prior Publication Data

US 2022/0302929 A1 Sep. 22, 2022

Related U.S. Application Data

(60) Provisional application No. 63/163,499, filed on Mar. 19, 2021.

(51) Int. Cl.
*H03M 13/00* (2006.01)
*H03M 13/15* (2006.01)

(52) U.S. Cl.
CPC ... *H03M 13/1515* (2013.01); *H03M 13/6563* (2013.01)

(58) Field of Classification Search
None
See application file for complete search history.

(56) References Cited

U.S. PATENT DOCUMENTS

| 5,910,960 | A * | 6/1999 | Claydon | H03M 13/151 |
| | | | | 714/784 |
| 6,327,690 | B1 * | 12/2001 | Zhang | H03M 13/15 |
| | | | | 714/784 |
| 9,009,577 | B1 * | 4/2015 | Tarn | H03M 13/2921 |
| | | | | 714/752 |
| 2003/0140303 | A1 * | 7/2003 | Litwin, Jr. | H03M 13/1585 |
| | | | | 714/785 |

(Continued)

OTHER PUBLICATIONS

Yancang Chen, Lunguo Xie, Jinwen Li and Zhonghai Lu, "Slice router: For fine-granularity fault-tolerant Networks-on-Chip," 2011 International Conference on Multimedia Technology, 2011, pp. 3230-3233, doi: 10.1109/ICMT.2011.6001912. (Year: 2011).*

(Continued)

*Primary Examiner* — Daniel F. McMahon
(74) *Attorney, Agent, or Firm* — Fenwick & West LLP

(57) ABSTRACT

A multi-port, multi-mode Reed Solomon (RS) forward error correction system includes a plurality of data in lines, each associated with a data port. The system includes a syndrome block (SDM) that has a plurality of syndrome slices and a SDM switching logic. An input of a SDM slice couples with a data in line from the plurality of data in lines. The switching logic couples with an interface port width (IFW) line a mode line. The IFW line identifies a number of data in lines tied together and the mode line to identify a RS mode. A reformulated inversionless Berlekamp-Massey (RiBM) block has a plurality of RiBM slices and a RiBM switching logic. A Chien Forney (ChFr) block has a plurality of ChFr slices. An error evaluation magnitude (ErEval) block has a plurality of ErEval slices. A plurality of adders couple with an output of a corresponding ErEval slice.

19 Claims, 13 Drawing Sheets

(56) References Cited

U.S. PATENT DOCUMENTS

2010/0011277 A1* 1/2010 Poeppelman ..... H03M 13/1595
714/784
2018/0358986 A1* 12/2018 Santhanam ....... H03M 13/6516

OTHER PUBLICATIONS

CMU. "Reed-Solomon Codes: An Introduction to Reed-Solomon Codes: Principles, Architecture and Implementation." Carnegie Mellon University: School of Computer Science, Jan. 31, 2001, 6 pages, [Online] [Retrieved Jan. 12, 2023], Retrieved from the Internet <URL:https://www.cs.cmu.edu/~guyb/realworld/reedsolomon/reed_solomon_codes.html>.

* cited by examiner

| Symbol-Position | Clk-0 | Clk-1 | . | . | Clk-15 | Clk-16 |
|---|---|---|---|---|---|---|
| 0 | $X^{543}$ | $X^{511}$ | | | $X^{63}$ | $X^{31}$ |
| 1 | $X^{542}$ | $X^{510}$ | | | $X^{62}$ | $X^{30}$ |
| . | | | | | | |
| . | | | | | | |
| 7 | $X^{536}$ | | | | | $X^{24}$ |
| 8 | $X^{535}$ | | | | | |
| . | | | | | | |
| . | | | | | | |
| 15 | $X^{528}$ | | | | | $X^{16}$ |
| 16 | $X^{527}$ | | | | | |
| . | | | | | | |
| . | | | | | | |
| 23 | | | | | | $X^{8}$ |
| 24 | | | | | | $X^{7}$ |
| . | | | | | | |
| . | | | | | | |
| 30 | $X^{513}$ | $X^{481}$ | | | | $X^{1}$ |
| 31 | $X^{512}$ | $X^{480}$ | | | $X^{32}$ | $X^{0}$ |

Symbol organization in RS (544,514)

*FIG. 3*

| Symbol Position | Clk-0 | Clk-1 | . | . | . | Clk-15 | Clk-16 |
|---|---|---|---|---|---|---|---|
| 0 | $X^{527}$ | $X^{495}$ |  |  |  | $X^{47}$ | $X^{15}$ |
| 1 | $X^{526}$ | $X^{494}$ |  |  |  | $X^{46}$ | $X^{14}$ |
| . | . | . |  |  |  | . | . |
| . | . | . |  |  |  | . | . |
| 7 | $X^{520}$ |  |  |  |  | . | . |
| 8 | $X^{519}$ |  |  |  |  | . | $X^{8}$ |
| . |  |  |  |  |  | . | . |
| . |  |  |  |  |  | . | . |
| 15 | $X^{512}$ |  |  |  |  | . | . |
| 16 | $X^{511}$ |  |  |  |  | . | $X^{1}$ |
| . |  |  |  |  |  | . | $X^{0}$ |
| . |  |  |  |  |  |  |  |
| 23 | $X^{504}$ |  |  |  |  |  |  |
| 24 | $X^{503}$ |  |  |  |  |  | Un-used,-(-Invalid) |
| . |  |  |  |  |  |  |  |
| . |  |  |  |  |  |  |  |
| 30 | $X^{497}$ | $X^{465}$ |  |  |  |  |  |
| 31 | $X^{496}$ | $X^{464}$ |  |  |  | $X^{16}$ |  |

Symbol organization in RS (528,514)

*FIG. 4*

| Symbol Position | Clk-0 | Clk-1 | . | . | Clk-7 | Clk-8 | |
|---|---|---|---|---|---|---|---|
| 0 | $X^{271}$ | $X^{239}$ | | | $X^{47}$ | $X^{15}$ | |
| 1 | $X^{270}$ | $X^{238}$ | | | $X^{46}$ | $X^{14}$ | ↑ |
| . | . | | | | | . | |
| . | . | | | | | . | S |
| 7 | $X^{264}$ | | | | | $X^{8}$ | |
| 8 | $X^{263}$ | | | | | . | ↓ |
| . | . | | | | | . | ↑ |
| . | . | | | | | $X^{1}$ | |
| 15 | $X^{256}$ | | | | | $X^{0}$ | S |
| 16 | $X^{255}$ | | | | | | |
| . | . | | | | | | ↓ |
| . | . | | | | | Un-used, (-Invalid) | ↑ |
| 23 | $X^{249}$ | | | | | | |
| 24 | $X^{248}$ | | | | | | S |
| . | | | | | | | |
| . | | | | | $X^{16}$ | | ↓ |
| 30 | $X^{241}$ | $X^{209}$ | | | | | |
| 31 | $X^{240}$ | $X^{208}$ | | | | | |

Symbol organization in RS (272,258)

*FIG. 5*

Chein-Forney Slice Port Association

MULTI-PORT—MULTI MODE REED SOLOMON DECODER

CROSS REFERENCE TO RELATED APPLICATIONS

This application claims the benefit under 35 U.S.C. § 119(e) of U.S. Provisional Patent Application Ser. No. 63/163,499, "MULTI-PORT-MULTIMODE REED SOLOMON DECODER," filed Mar. 19, 2021 which is incorporated herein by reference in its entirety.

TECHNICAL FIELD

The present disclosure generally relates to an electronic communication system. In particular, the present disclosure relates to an architecture of Reed Solomon (RS) forward error correction (FEC) decoding targeted towards multiport, multimode wireline communications.

BACKGROUND

High speed data communications are susceptible to noise, which results in corruption of the data during transmission. Forward error correction (FEC) schemes have been developed to enable receivers to detect and correct errors in the data they receive. A FEC scheme is a method of controlling errors in data transmission by transmitting redundant data by a source (transmitter). The redundant data allows the destination (receiver) to detect a limited number of errors or to correct such errors without re-transmission. Typically, stronger FEC schemes are used for faster data rates. A stronger FEC scheme is one that can detect and correct a greater number of bit errors in a block of data than a weaker FEC scheme. The 112 gigabits per second (Gbps) Ethernet physical layer (PHY) is a component that operates at the physical layer of the Open Systems Interconnection (OSI) network model and supports Pulse-Amplitude Modulation 4-Level (PAM-4), Non-Return-to-Zero (NRZ) signaling, and independent, per lane data rates to address a broad range of protocols and applications. PAM-4 is a multilevel signal modulation format used to transmit a signal, where each signal level can represent 2 bits of logic information. NRZ is a binary code using low and high signal levels to represent the level 1 or 0 information of a digital logic signal. In a high speed data communication system such as 112 Gbps PHYs and 224 Gbps PHYs, NRZ and PAM-4 coding may include forward error correction (FEC) schemes.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 3 illustrates a table corresponding to an example organization of received symbols of RS (544,514) spread across 17 clock cycles, where Xi refers to the symbol value at position 'i' in the code word.

FIG. 4 illustrates a table corresponding to an example organization of received symbols of RS (528,514) spread across 17 clock cycles, where Xi refers to the symbol value at position 'i' in the code word.

FIG. 5 illustrates a table corresponding to an example organization of received symbols of RS (272,258) spread across 9 clock cycles, where $X^i$ refers to the symbol value at position 'i' in the code word.

DETAILED DESCRIPTION

Figure 1:
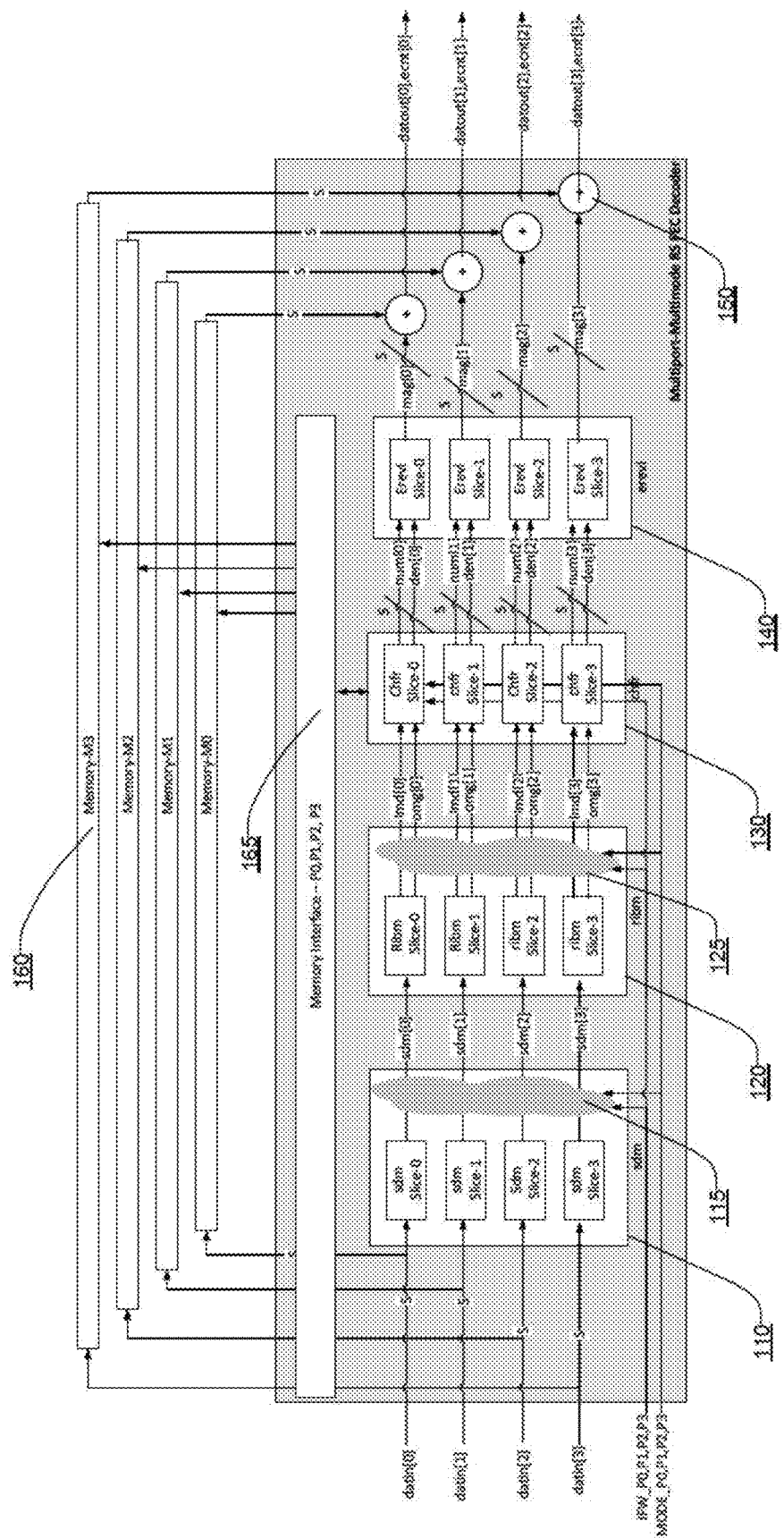
FIG. 1 is a block diagram illustration of an example multi-port multi-mode Reed Solomon decoder system in accordance with one embodiment.

In a high speed data communication system such as 112 Gbps PHYs and 224 Gbps PHYs, NRZ and PAM-4 coding may include FEC schemes. As per Institute of Electrical and Electronic Engineers (IEEE) 02.3-cd specification, the following Reed Solomon Codes (RS FEC) have been defined based on the PHY lane rate.

The following table shows IEEE 802.3 complaint 400G, 800G PHY needing the following RS FEC modes to be supported

| Physical coding sublayer (PCS) maximum speed node | Number of PHY lanes@ rates | Mode of operation | Line coding | RS FEC mode supported |
|---|---|---|---|---|
| 400 G | 4@112 G max | 400 G | PAM-4 | RS (544, 514) Interleaved mode |
| | | 200 G | PAM-4 | RS (544, 514) Interleaved mode |
| | | 100 G | PAM-4 | RS (544, 514) Interleaved mode |
| | | | PAM-4 | RS (544, 514) |
| | | | NRZ | RS (528, 514) |
| | | 50 G | PAM-4 | RS (544, 514) |
| | | | NRZ | RS (544, 514) |
| | | | NRZ | RS (528, 514) |
| | | 25 G | NRZ | RS (528, 514) |

The RS (544,514) interleaved mode refers to the data entering the RS FEC layer that is split (or interleaved) into two streams on a symbol-by-symbol basis (each symbol is 10 bits wide). RS(544,514) corresponds to Reed Solomon FEC code word with 544 symbols of which 514 are message symbols and rest 30 are parity symbols, each symbol being 10-bit wide. The notation RS(M, N) represents data entering the RS FEC layer that has N symbols, each symbol may be represented using multiple bits, for example, 10 bits. The decoder adds K parity symbols such that N+K=M and generates M symbol code word. Each stream is encoded separately on the transmit side. The combined stream is sent over the channel. On the receiver side, the stream is split (de-interleaved) into two and a complementary decoding operation is performed to detect and correct the errors (if any).

Typical approaches that use multiple instances of RS-FEC decoder catering to each mode are not optimal with respect to gate count and memory relative to the area (footprint) needed on an integrated circuit. Further, when working with various speed modes (25G, 50G, 100G, 200G, 400G and 800G), it may be necessary to support variable interface widths (different number of symbols entering and leaving the decoder). Approaches that use a data packing stage at the input of the decoder and a data unpacking stage at the output of the decoder have increased overall latency.

The present multi-port, multi-mode RS FEC system supports various interface widths (symbols per clock) as well as various modes simultaneously so that gate count, memory footprint and codec latency are optimal (e.g., reduced). Also, when there are multiple ports to be supported, the present multi-port multi-mode RS FEC system shares the codec engine considering the FEC mode and speed requirements of each port.

By way of example, the present multi-port, multi-mode RS FEC system includes multiple data in lines, each associated with a data port. The system includes a syndrome block (SDM) that has multiple syndrome slices and an SDM switching logic. The switching logic may also be referred to herein as glue logic. An input of a SDM slice couples with a data in line from the multiple data in lines. The switching logic couples with an interface port width (IFW) line and a mode line. The IFW line identifies a number of data in lines tied together and the mode line to identify an RS mode. A reformulated inversionless Berlekamp-Massey (RiBM) block has multiple RiBM slices and an RiBM switching logic. Each RiBM slice couples with an output of a corresponding SDM slice. The RiBM switching logic couples with the IFW line and the mode line. A Chien Forney (ChFr) block has multiple ChFr slices. Each ChFr slice couples with an output of a corresponding RiBM slice. Each ChFr slice also couples with the IFW line and the mode line. An error evaluation magnitude (ErEval) block has multiple ErEval slices. Each ErEval slice is coupled with an output of a corresponding ChFr slice. The system further includes multiple adders coupled with an output of a corresponding ErEval slice and a corresponding memory coupled with a respective data in line coupled with the corresponding SDM slice to identify, fix, and output an error location.

The disclosed configuration finds use in in line error detection and correction in high speed low latency wireline communications based on IEEE 802.3-cd, 802.3-ck physical coding sub layer using 112 Gbps PHYs and beyond. The present architecture allows the common decoder engine to be shared across multiple ports thus optimizing both gate count and memory footprint. The shared usage of codec is beneficial specifically in Enterprise Ethernet applications/switches/routers where multiport feature is a necessary requirement.

The present RS-FEC decoder architecture supports sharing of codec hardware supporting (1) independent port speeds (supporting 25G, 50G, 100G, 200G, 400G and 800G); (2) a dynamic interface width for each port; (3) a dynamic FEC mode selection for each port; and achieves optimal area, memory footprint and latency figures.

FIG. 1 is a block diagram illustration of an example multi-port multi-mode Reed Solomon decoder system for forward error correction (FEC) in accordance with one embodiment. For ease of discussion, a four-port example is considered but the principles described apply to any number of ports.

A multi-port multi-mode Reed Solomon decoder system 100 includes one or more data input lines (datin), a syndrome block 110 having one or more syndrome slices, a reformulated inversionless Berlekamp-Massey (RiBM) block 120 having one or more RiBM slices, a Chien Forney block (ChFr) 130 having one or more ChFr slices, and an error evaluation magnitude (Erevl) block 140 having one or more error evaluation magnitude slices. Also included are adders 150 to combine results from error evaluation magnitude slices (identified as +). According to an embodiment, SDM slice, RiBM slice, Chfr slice, Erevl slice are all implemented in hardware.

The number of slices in a block may correspond to the number of data input lines into the system 100. The data input lines may correspond to a port through which data to be decoded is received. Two or more ports may be tied together (multi-port). In addition, different Reed Solomon (RS) error correction modes may be used to analyze the data (multi-mode). The data input couples with a corresponding slice in the syndrome block xxx and a corresponding memory 160 (M0 through Mx, x corresponding to a positive integer (where x is one less than the number of data in lines if x starts at 0) of the data line) via a memory interface 165. In addition, the syndrome block 110, the RiBM block 120, and the ChFr block 130 are coupled with an interface port width (IFW) line which identifies the number of ports on which data is input and a mode line that identifies the specific Reed-Solomon (RS) mode. The IFW line and mode line couple with switching logic 110, 120 in the syndrome block and RiBM block respectively. The IFW line and the mode line couple with each slice in the ChFr block. An error evaluation magnitude slice (Erevl slice) in the Erevl block 140 couples with a corresponding error correction logic 150 (e.g., error correction logic may be a Galois field adder). The corresponding adder (+) 150 also couples with a corresponding memory 160 of the data input line. The error evaluator provided error magnitude is added to the erroneous symbol positions in the code word to correct the errors. Further operational details are provided below.

As shown, the data—datin[0], datin[1], datin[2] and datin[3] is input into the decoder. Each datin[ ] carries S symbols per clock, where a symbol corresponds to m-bit data (where S and m are positive integers) corresponding to Galois Field $GF(2^m)$. The association of datin[ ] to a port is dependent on the interface width of each port (IFW_Px). A port could work with either S, 2S or 4S symbols per clock and is indicated by IFW_Px control input where Px can be P0, P1, P2 or P3 and IFW_Px can take value of S, 2S or 4S as given in the below table.

TABLE 1

Port association table

| IFW_P0 | IFW_P1 | IFW_P2 | IFW_P3 | Description |
|---|---|---|---|---|
| 4S | — | — | — | The input 4S symbols datin[0], datin[1], datin[2] and datin[3] corresponding to Port-0 access memory-M0, M1, M2 and M3 respectively<br>Port-1, 2, 3 are inactive. |
| 2S | — | 2S | — | The first 2S symbols datin[0], datin[1], corresponding to Port-0 access memory M0, M1<br>The next 2S symbols datin[2], datin[3], corresponding to Port-2 access memory M2, M3<br>Port-1, 3 are inactive. |
| 2S | — | 1S | 1S | The first two 2S symbols datin[0], datin[1], corresponding to Port-0 access memory M0, M1<br>The third S symbols datin[2] corresponding to Port-2 access memory M2<br>The fourth S symbols datin[3] corresponding to Port-3 access memory M3<br>Port-1 is inactive. |
| 1S | 1S | 1S | 1S | The S symbols datin[0] corresponding to Port-0 access memory M0<br>The S symbols datin[1] corresponding to Port-1 access memory M1<br>The S symbols datin[2] corresponding to Port-2 access memory M2<br>The S symbols datin[3] corresponding to Port-3 access memory M3 |
| — | 2S | X | X | Illegal, not supported |
| — | — | 2S | — | The 2S symbols datin[2], datin[3] corresponding to Port-2 access memory M2 and M3 respectively<br>Port-0, 1, 3 are inactive |
| — | — | — | 2S | Illegal, not supported |
| — | — | — | 1S | The S symbols datin[3] corresponding to Port-3 access memory M3<br>Port-0, 1, 2 are inactive |

The input data to be decoded is fed to the syndrome block 110 and also written to the memory 160.

Figure 2:
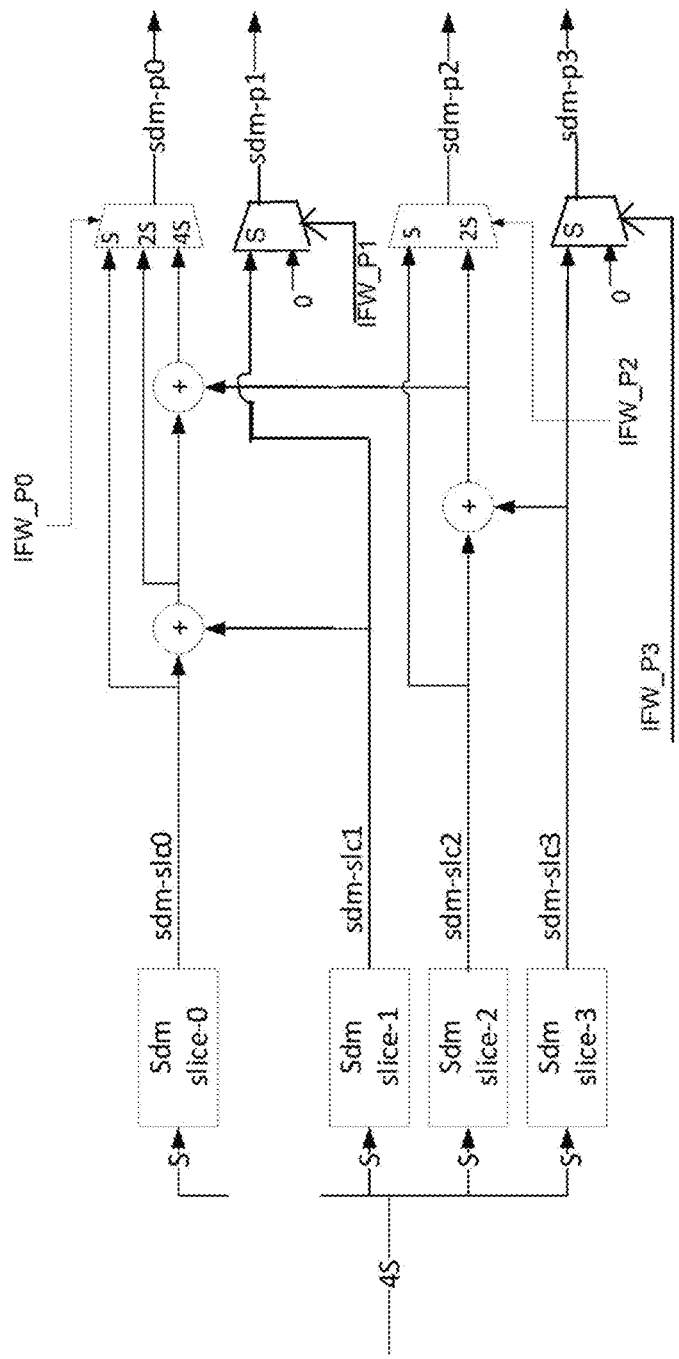
FIG. 2 illustrates example logic (e.g., syndrome block) for combining the outputs from syndrome slices based on interface width (S, 2S or 4S) for a given port.

The syndrome block 110 calculator has four parallel syndrome data path slices in this example with 4 ports. When a port is working with S symbols per clock, the corresponding slice's output directly gives the syndrome value. When a port is working with more than S symbols per clock, the outputs from the associated slices are considered to generate the final syndrome value. FIG. 2 illustrates example logic (e.g., a syndrome block) for combining the outputs from syndrome slices based on interface width (S, 2S or 4S) for a given port. Each syndrome slice (e.g., Slice-0, Slice-1, Slice-2, or Slice3) of the syndrome block in FIG. 2 computes syndrome independently. The syndrome computation within each slice involves evaluating the received code word for the primitive element (a=2) raised to the power from 0 to 2*t—where 't' is the error correction capability of the code under consideration. This scheme of syndrome computation is well known anyone who is skilled in this art of RS FEC Decoder design. The switching logic sits outsides the syndrome slices. The logic 115 refers to the switching logic that allows combining the syndrome results from different slices and configuring them in various ways. If the IFW_P0,P1,P2,P3=S, then syndrome slices work independently. If IFW_P0=2S, then slice-0 and slice-1 work together for port-0. If IFW_P2=2S, then slice-2 and slice-3 work together for port-2. If IFW_P0=4S, then, slice-0 to slice This way based on the required input symbol parallelism the syndrome slices get associated with a particular port. But it may also be possible that each port is working with a different mode. For example, in IEEE 802.3 a port may operate with one of, for example, (1) RS(544,514) code word, which is the maximum code word (say C1); (2) RS(528,514) code word (say C2), or (3) RS(272,258) code word (say C3) modes—where RS(n,k) k message symbols and (n-k) arity symbols forming a code word with n symbols. If the syndrome slice in the syndrome block determines based on the error detection logic of the slice that the received data on the data input line has no error corresponding to all syndromes having value of 0, the data is passed through the system 100. When, however, an error is found, when at least one of the syndromes is non zero, the system further processes the data within the system 100 as described here.

At the RS decoder side, the received symbols need to be organized in the required order for proper decoding. FIG. 3 illustrates a table corresponding to an example organization of received symbols of RS(544,514) spread across 17 clock cycles, where $X^i$ refers to the symbol value at position 'i' in the code word. The clock CLK-0 processes the first set of 32 symbols $X^{543}$-$X^{512}$, the clock CLK-1, processes the next set of 32 symbols $X^{511}$-$X^{480}$, and so on until clock CLK-16 processes the last set of symbols $X^{31}$-$X^0$. FIG. 4 illustrates a table corresponding to an example organization of received symbols of RS(528,514) spread across 17 clock cycles, where $X^i$ refers to the symbol value at position 'i' in the code word. As shown in FIG. 4, the clock CLK-0 processes the first set of 32 symbols $X^{527}$-$X^{496}$, the clock CLK-1, processes the next set of 32 symbols $X^{495}$-$X^{164}$, and so on until clock CLK-16 processes the last set of 8 symbols $X^{15}$-$X^0$ such that the last 8 symbols are unused. FIG. 5 illustrates a table corresponding to an example organization of received symbols of RS(272,258) spread across 9 clock cycles, where $X^i$ refers to the symbol value at position 'i' in the code word. As shown in FIG. 4, the clock CLK-0 processes the first set of 32 symbols $X^{271}$-$X^{240}$, the clock CLK-1, processes the next set of 32 symbols $X^{239}$-$X^{208}$, and so on until clock CLK-16 processes the last set of 8 symbols $X^{15}$-$X^0$ such that the last 8 symbols are unused.

With the syndrome slices' functionality being identical for all the FEC modes, the Mathematical output for the RS(528,514) mode, RS(272,258) mode from the syndrome slices (sdm-p0/p1/p2/p3) would be as below. For RS 528 S528[j]:

$$(a^j)^{543}*x^{543}+(a^j)^{542}*x^{542}+\ldots+(a^j)^{18}*x^2+(a^j)^{17}*x+C*(a^j)^{16}$$

Figure 6:
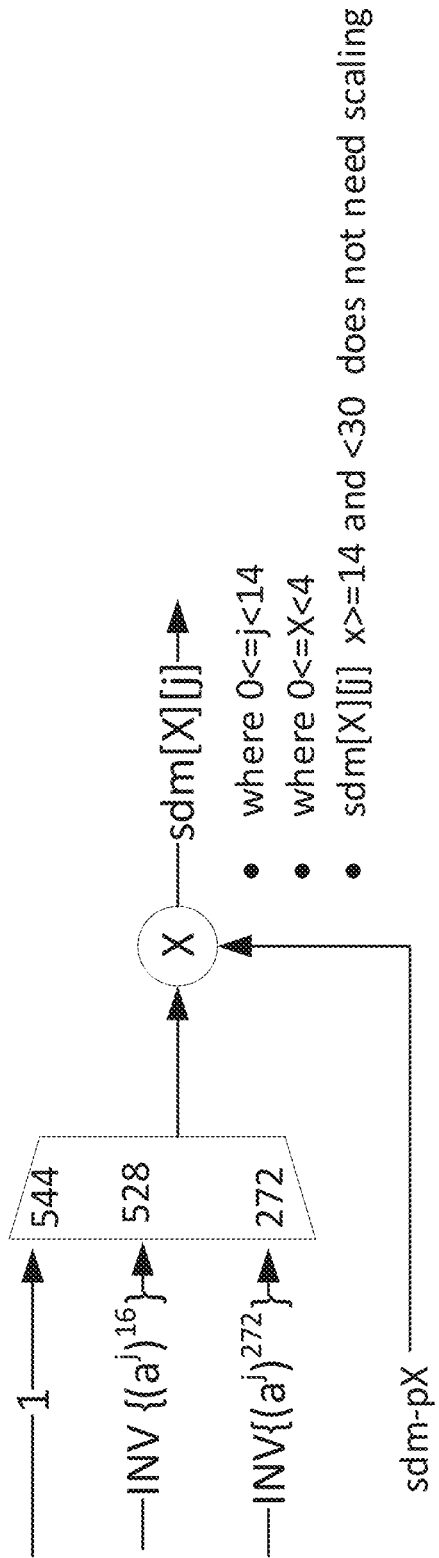
FIG. 6 illustrates example logic for syndrome scaling.

For RS 272 S272[j]:

$$(a^j)^{543}*x^{543}+(a^j)^{542}*x^{542}+\ldots+(a^j)^{274}*x^2+(a^j)^{273}*x+C*(a^j)^{272}$$

Where a is the primitive value with value of 2
j is an integer ranging from 0 to 't' (equals 7)
C is a constant Referring to FIG. 2, this requires the each port's syndrome value outputs sdm-p0/p1/p2/p3 to be scaled whenever the code word for a port is not corresponding to the maximum code word (in the above example RS(544,514) is the maximum code word). FIG. 6 illustrates example logic for syndrome scaling and syndrome scaling is done for each slice's output. In FIG. 6 'X' caters to slices 0 to 3, 'j' is an integer from 0 to 13 in lines with the 14 parity symbols present in RS(528,514) and RS(272,258)

The scaling factors for RS(528,514) is $(a^j)^{16}$, where 0<=j<14
The scaling factors for RS(272,514) is $(a^j)^{272}$, where 0<=j<14

The outputs sdm[X][j] are the final syndromes fed to the RiBM block for error locator and error evaluator polynomial determination. The pseudo code inside syndrome slices is given below. According to an embodiment, the various blocks Syndrome, RiBM, ChFr, Erevl are implemented using hardware, for example, VLSI circuits. The following pseudocode represents the logic implemented by the circuit.

prv_scl scales the previously accumulated partial result in syndrome slice calculation. Based on interface width set (IFW), the scaling factor is calculated as below

```
for (j = 0 ; j < (2*tmax) ; j++)
  case (IFW)
    4S  : prv_scl[j] = ((a^j)^45);  /* 4S symbols per clock */
    2S  : prv_scl[j] = ((a^j)^25);  /* 2S symbols per clock */
    1S  : prv_scl[j] = ((a^j)^15);  /* 1S symbols per clock */
``` cur_scl scales the current clock cycle's accumulated partial result in syndrome slice calculation. Based on interface width set (IFW), the scaling factor is calculated as below

```
for (j = 0 ; j < (2*tmax) ; j++)
  for ( i = 0; i < S ; i++)
    case(IFW)
      1S  : cur_scl[j][i] = ((a^j)^(0*S+i));  /* 1S symbols per clock */
      2S  : cur_scl[j][i] = ((a^j)^(1*S+i));  /* 2S symbols per clock */
      4S  : cur_scl[j][i] = ((a^j)^(3*S+i));  /* 4S symbols per clock */
```

In the first clock cycle of the code word, only the current accumulated result is considered. In other clock cycles of the code word, previously accumulated result (from previous clock cycles) is scaled and added to current clock cycle's accumulated result and is stored back for next clock cycle's computation

```
/* Accumulator register */
for (j = 0 ; j < (2*tmax) ; j++)
  if ( start of code word)
    acc_new_r[j] <= acc_new[j][S-1];
  else
    ace_new_r[j] <= prv_scl[j] * acc_new_r[j] + acc_new[j][S-1];
```

Following code is the accumulator working on current clock cycle's data

```
/* Accumulator combinatorial */
for (j = 0 ; j < (2*tmax) ; j++)
  for(i = 0 ; i < S; i++)
    if ( i == 0 )
      acc_new [j][i] = (cur_scl[j][i] * data[S -1 -i]);
    else
      acc_new [j][i] = acc_new[j][i-1] + (cur_scl[j][i] * data[S-1 -i]);
  sdm_slc[j] = acc_new_r[j]
where
i and j are integer type loop control variables
``` prv_scl[j]—Each entry of prv_scl[j] holds a value belonging to GF($2^m$) where m is the number of bits representing one symbol in Galois Field.

tmax—refers to the highest value of the maximum error correction capability among all the supported codes. For example when RS(544,514,10), RS(528,514,10) and RS(272,258,10) are supported, tmax refers to 15 corresponding to the error correction capability of up to 15 symbols of RS(544,514).

IFW—Interface width, which corresponds to a port working with either S, 2S or 4S symbols per clock a—'a' is the primitive element of the field GF($a^m$)

$a^x$—refers to primitive element raised to the power x in the Galois Field GF($2^m$)

Figure 7:
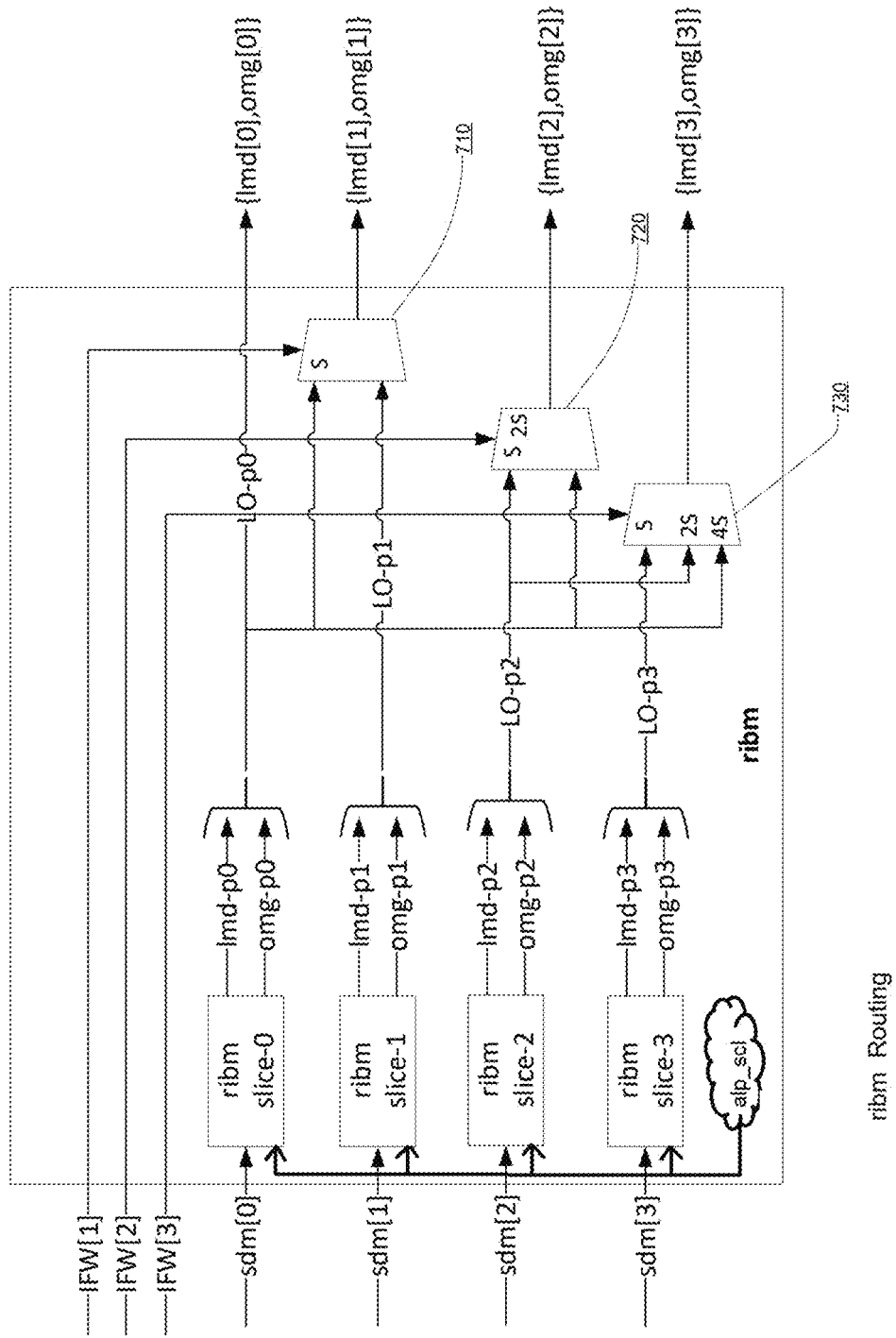
FIG. 7 illustrates an example RiBM routing logic for output to a Chien Forney block having Chien-Forney slices.

Given the syndrome values of each port, the RiBM slices (reformulated inversion less BerleyKemp Messey algorithm) are used in an iterative way to determine the error locator and error evaluator polynomials. As the ports are independent, the present decoder system includes dedicated RiBM slices per port so as to have no impact on latency. If latency is not critical, the RiBM slice(s) could be time shared across multiple ports where-in syndrome from different ports are multiplexed (MUXED) in a round-robin fashion and fed to the time shared RiBM slices, thus saving gate count at the cost of latency. The output from individual RiBM slices are routed to Chien-Forney slices based on the symbol parallelism of the ports. FIG. 7 illustrates an example RiBM routing logic. FIG. 7 shows a multiplexing logic according to an embodiment. The circuit uses the multiplexers 710, 720, and 730 to combine various outputs of slices ribm, e.g., slice-0, slice-1, slice-2, and slice-3. For example, based on the inputs IFW[1], IFW[2], and IFW[3], the various multiplexers 710, 720, and 730 may configured to either pass the outputs lmd-p0 and om,g-p0 directly as lmd[0], omg[0] or combine two or more combinations of outputs, for example, combine lmd-p0, omgp-0 with lmd-p1, omg-p1 to output lmd[1], omg[1], and so on. Accordingly, the multiplexers are configured based on the inputs IFW[1], IFW[2], and IFW[3], to implement various combinations of outputs of the ribm slices. The following table summarizes the routing logic

| | | |
|---|---|---|
| Lmd[0], Omg[0] | Route with LO-p0 | Route Port-0 RiBM result to Port-0 Chein-Forney block |
| Lmd[1], Omg[1] | If IFW_P1 = S, route LO-p1 Else route LO-p0 | Route Port-1 RiBM result to Port-1 Chein-Forney block if Port-1 is working with S symbols Else Route Port-0 RiBM result to Port-1 Chein Forney |
| Lmd[2], Omg[2] | If IFW_P2 = 4S, route LO-p0 Else route LO-p2 | If Port-2 Interface width is 4S, then route Port-0 Ribm result to Port-2 Chein Forney block Else Route Port-2 Ribm result to Port-2 Chein Forney block |
| Lmd[3], Omg[3] | If IFW_P3 = S, route LO-p3 If IFW_P3 = 2S, route LO-p2 Else route LO-p0 | If Port-3 Interface width is S, then route Port-3 Ribm result to Port-3 Chein Forney block If Port-3 Interface width is 2S, then route Port-2 Ribm result to Port-3 Chein Forney block Else route Port-0 Ribm result to Port-3 Chein Forney block |

Figure 8:
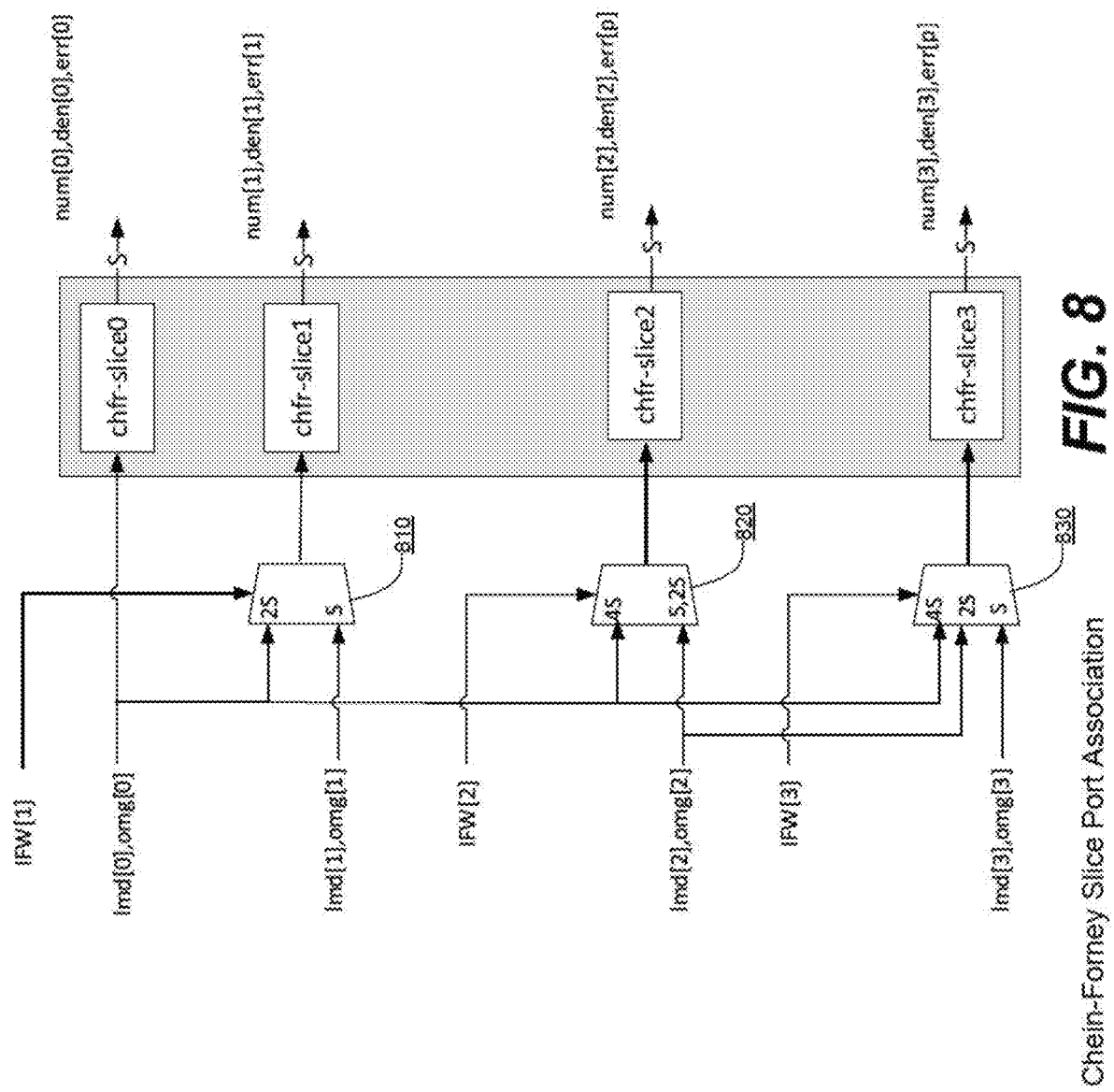
FIG. 8 illustrates an example association of the slices to ports that is tied to the interface width (IFW) of the port

A Chien Forney block includes Chien-Forney slices. Each chien-Forney slice use Error locator polynomial (lmd[i] for ith slice, and i=0,1,2,3) to find the roots of the effort locations. The method to evaluate the error locator polynomial is available in relevant literature and not repeated here. Similarly the error evaluator (omg[i] for ith slice, and i=0,1,2,3) is evaluated as is known in the technical literature. FIG. 8 illustrates an example association of the slices to ports is tied to the interface width (IFW) of the port. The multiplexers 810, 820, and 830, are configured by the inputs IFW[1], IFW[2], and IFW[3] respectively to select the appropriate combinations of the signals lmd[0], omg[0]; lmd[1], omg[1]; lmd[2], omg[0]; and lmd[3], omg[3] and provide them as input to the slices of the CHFR block 130, i.e., slices chfr-slice0, chfr-slice1, chfr-slice2, and chfr-slice3. This generates the output of the CHFR block 130, i.e., num[0], den[0], err[0]; num[1], den[1], err[1]; num[2], den[2], err[2]; and num[3], den[3], err[3] respectively from slice chfr-slice0, chfr-slice1, chfr-slice2, and chfr-slice3 respectively. The steps of a process for generation for alp_scl are given below as pseudocode.

```
alp_scl refer to the scaling values to be used in the RiBM slice operations.
alp_scl is used to generate various powers of alpha ( primitive element) to
solve the error locator and error evaluator equations
The value of alp_scl is generated based on the interface width
for(p=0;p<Num_slices; p=p+1) // Here Num slices = 1,2 or 4 based on
Number of ports = 1,2 or 4
    for (i = 0 ; i <= tmax/2 ; i= i+1)
        switch(IFW[p])
        S   : alp_scl[p][i] = (a^(1*S*(i+1)));
        2S  : alp_scl[p][i] = (a^(2*S*(i+1)));
        4S  : alp_scl[p][i] = (a^(4*S*(i+1)));
```

The error evaluator polynomial needs a scaling factor for RiBM algorithm. The scaling factor value changes based on the position of the slice and the operating mode. Following are the steps of a process for calculating the scaling factor for the error evaluator (Omega). Lamda is Error locator Polynomial Omega is Error Evaluator Polynomial.

```
The scaling factor generated is a function of
a) the offset of the chien-Forney slice.
```

```
b) The RSFEC mode of operation – RS(544,514), RS(528,514) and
RS(272,514)
for(p=0;p<Number of ports; p=p+1)
    for (i = 0 ; i < S ; i=i+1)
        if ( init | end of code word )
            case(port_ofst[p])
            0  :omg_scl[p][i] <= 528_mode[p] ? ((inv2_528 *
                                a^(i+0*S)))^PARITY_528_272 :
                                ((inv2_544 * a^(i+0*S)))^PARITY_544       ;
            1  :omg_scl[p][i] <= 528_mode[p] ? ((inv2_528 *
                                a^(i+1*S)))^PARITY_528_272 :
                                ((inv2_544 * a^(i+1*S)))^PARITY_544       ;
            2  :omg_scl[p][i] <= 528_mode[p] ? ((inv2_528 *
                                a^(i+2*S)))^PARITY_528_272 :
                                ((inv2_544 * a^(i+2*S)))^PARITY_544       ;
            3  :omg_scl[p][i] <= 528_mode[p] ? ((inv2_528 *
                                a^(i+3*S)))^PARITY_528_272 :
                                ((inv2_544 * a^(i+3*S)))^PARITY_544       ;
        Else
for(p=0;p<Number of ports; p=p+1)
    for (i = 0 ; i < S ; i=i+1)
        switch(IFW[p])
        S:omg_scl[p][i] <= (528_mode[p] | 272_mode[p]) ?
                           (omg_scl[p][i] * ((a^1*S)^PARITY_528_272)) :
                           (omg_scl[p][i] * ((a^1*S)^PARITY_544      )) ;
        2S:omg_scl[p][i] <= (528_mode[p] | 272_mode[p]) ?
                           (omg_scl[p][i] * ((a^2*S)^PARITY_528_272)) :
                           (omg_scl[p][i] * ((a^2*S)^PARITY_544      )) ;
        4S :omg_scl[p][i] <= (528_mode[p] | 272_mode[p]) ?
                           (omg_scl[p][i] * ((a^4*S)^PARITY_528_272)) :
                           (omg_scl[p][i] * ((a^4*S)^PARITY_544      )) ;
```

Figures 9A, 9B:
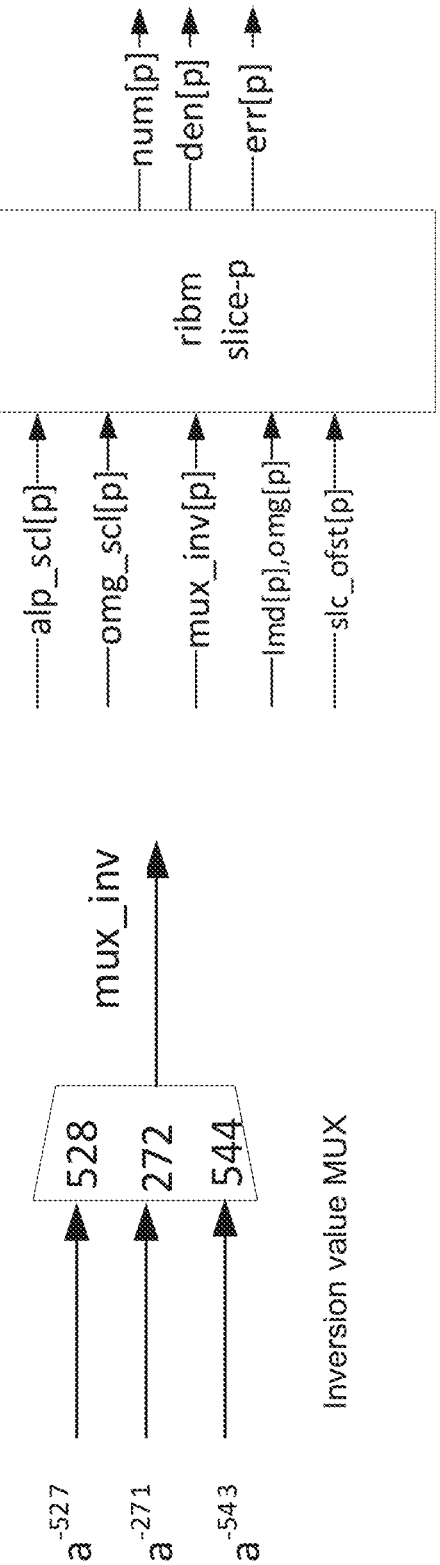
FIG. 9A illustrates an example multiplexer (MUX) that selects the inverse factors based on the mode of operation.
FIG. 9B illustrates example inputs and outputs of an RiBM slice.

FIG. 9A illustrates an example multiplexer (MUX) that selects the inverse factors based on the mode of operation. The inverse factors are used in the generation of alp_pwr which carry the primitive power (alpha) raised to the required power values. Thee values are needed in the evaluation of Error locator and Error evaluator polynomials. FIG. 9B illustrate example inputs and outputs of a ribm slice. The pseudo code of the logic inside a RiBM slice is given below.

```
for (t = 0 ; t <= (tmax) ; t= t+1)
    for ( s = 0; s < S ; s=s+1)
    if( init | reset)
        switch(slc_ofst) // slc_ofst can take value 0,1,2,3 for 4 slices
        1  :alp_pwr[t][s] <= ((muxinv)^t)^(s + S*1));
        2  :alp_pwr[t][s] <= ((muxinv)^t)^(s + S*2));
        3  :alp_pwr[t][s] <= ((muxinv)^t)^(s + S*3));
        0  :alp_pwr[t][s] <= ((muxinv)^t)^(s + S*0));
        endcase
    else if (till last cycle)
        alp_pwr[t][s] <= (alp_pwr[t][s] * alp_scl[t]);
```

The following lines show the pseudo code for evaluating the Error evaluator (omg) and Error locator (lmd) using alp_pwr.

```
for(i=0;i<= tmax;i=i+1)
    for(j=0;j<S;j=j+1)
        lmd_prod[i*S+j] = (alp_pwr[i][j] * lmd_in_q[i+1]);
for(i=0;i<tmax;i=i+1)
    for(j=0;j<S;j=j+1)
        omg_prod[i*S+j] = gf_mul (alp_pwr[i][j] * omg_in_q[i+1]);
```

The rest of the evaluations of lmd and Omg are as per the Chien-Forney algorithm. The evaluation yields the Numerator "num[p]", and denominator "den[p] and Error location err[p]". The num[p]/den[p] is used to find out the error magnitude as per Chien-Forney Algorithm.

Figure 10:
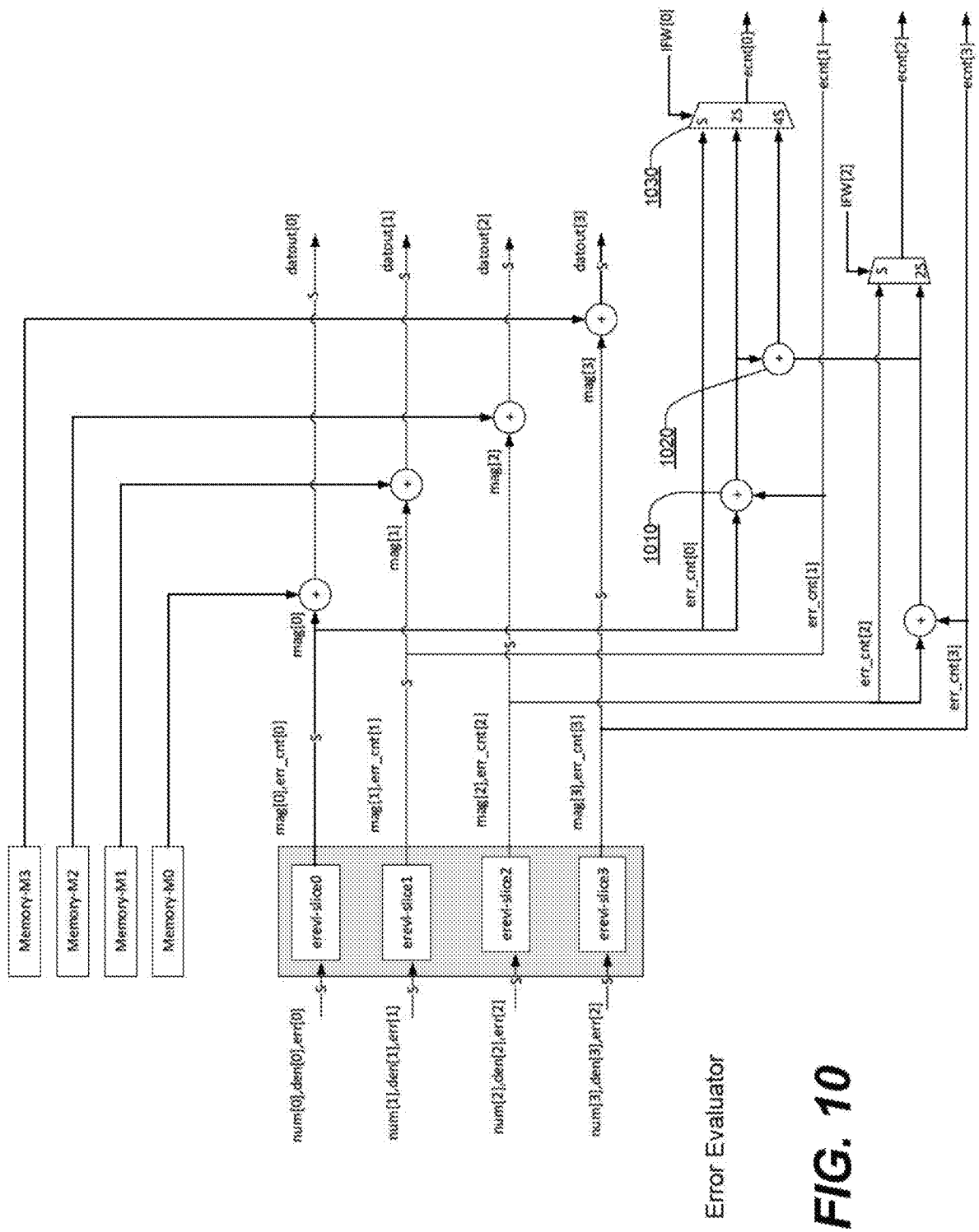
FIG. 10 illustrates an example of final error counts considering the interface widths of determined different ports.

The Erevl block evaluates and corrects errors by finding error magnitudes and also determines the total number of errors present in the code word. FIG. 10 illustrates a block diagram of a multiport error evaluator. FIG. 10 shows adders that combine the appropriate magnitudes (mag[0], mag[1], mag[2], mag[3]) and error count values (err_cnt[0], err_cnt[1], err_cnt[2], err_cnt[3]) in accordance with the interface width value IFW received. The appropriate combinations of the magnitude values are output as the data out value (datout[0], datout [1], datout [2], datout [3]) and the combined values of error count are output as the values (ecnt[0], ecnt[1], ecnt[2], ecnt[3]).

Here is a brief summary of the switching operations done in FIG. 10

| Interface width | Corrected Data output |
|---|---|
| datout [0] | mag[0] + Memory M0 Read Data |
| datout [1] | mag[1] + Memory M1 Read Data |
| datout [2] | mag[2] + Memory M2 Read Data |
| datout [3] | mag[3] + Memory M3 Read Data |

| Interface width of Port-0 | Error count of Port-0 |
|---|---|
| S | ecnt[0] = err_cnt[0] |
| 2S | ecnt[0] = err_cnt[0] + err_cnt[1] |
| 4S | ecnt[0] = err_cnt[0] + err_cnt[1] + err_cnt[2] + err_cnt[3] |

| Interface width of Port-1 | Error count of Port-1 |
|---|---|
| S | ecnt[1] = err_cnt[1] |
| 2S | Invalid, Not supported |
| 2S | Invalid, Not supported |

| Interface width of Port-2 | Error count of Port-2 |
|---|---|
| S | ecnt[2] = err_cnt[2] |
| 2S | ecnt[2] = err_cnt[2] + err_cnt[3] |
| 4S | Invalid. Not supported |

| Interface width of Port-3 | Error count of Port-3 |
|---|---|
| S | ecnt[3] = err_cnt[3] |
| 2S | Invalid. Not supported |
| 4S | Invalid. Not supported |

For example, the adder adds err_cnt[0] and err_cnt[1] and adder 1020 adds err_cnt[0], err_cnt[1], and err_cnt[2]. The multiplexer 1030 selects the appropriate sum of err_cnt values depending on the interface width IFW[0] to return err_cnt[0] if interface width S is selected, the sum of err_cnt[0] and err_cnt[1] if interface width 2S is selected and sum of err_cnt[0], err_cnt[1], and err_cnt[2] if interface width 4S is selected. The error magnitude mag[p] and error count err_cnt[p] are determined using the standard decoding algorithm. FIG. 10 illustrates an example of final error counts considering the interface widths of determined different ports.

The below table captures the features required to target 25G to 400G speed modes supporting 4 ports.

| Design Parameters | Description |
|---|---|
| Codec Modes using $GF(2^{10})$ | RS(544, 514), RS(528, 514) and RS(272, 258) |
| Maximum Number of ports | 4 |
| Interface widths | 4 ports: 8 symbols per clock<br>2 ports: 8, 16 symbols per clock<br>1 port: 8, 16 or 32 symbols per clock |

Results table-1: Features supported

These features are taken as baseline to compare the performance of discrete instances of RS FEC decoder versus the proposed multiport multimode decoder.

The results of the comparison are as follows. The following table shows relative area of (1) Single mode single port RS544 Decoder (2) Dual mode Dual port Decoder (RS544+RS528 support for 2 ports) (3) Tri Mode Dual port (RS544, RS528, RS272 support for 2 ports) (4) Dual mode Quad port Decoder (RS544+RS528 support for 4 ports) (5) Tri Mode Quad port (RS544, RS528, RS272 support for 4 ports) With respect to single mode single port RS528 decoder—whose area is taken as 1.0.

| Configuration | Symbol Parallelism | RS(544, 514) only (A) | RS(528, 514) only (B) | RS(544, 514) only + RS(528, 514) only (A) + (B) | Dual Mode RS(544, 514) & RS(528, 514) (C) | Tri Mode RS(544, 514), RS(528, 514) & RS(272, 258) (D) |
|---|---|---|---|---|---|---|
| Decoder-1 port | 8 | 2.0 | 1.0 | 3.0 | 3.0 | 3.0 |
| Decoder-1 port | 16 | 3.1 | 1.6 | 4.7 | 5.1 | 5.2 |
| Decoder-2 ports | 16 | Not applicable | Not applicable | Not applicable | 6.1 | 6.1 |
| Decoder-1 port | 32 | 5.6 | 2.8 | 8.4 | 9.7 | 9.5 |
| Decoder-2 ports | 32 | Not applicable | Not applicable | Not applicable | 10.7 | 10.5 |

-continued

| Configuration | Symbol Parallelism | RS(544, 514) only (A) | RS(528, 514) only (B) | RS(544, 514) only + RS(528, 514) only (A) + (B) | Dual Mode RS(544, 514) & RS(528, 514) (C) | Tri Mode RS(544, 514), RS(528, 514) & RS(272, 258) (D) |
|---|---|---|---|---|---|---|
| Decoder-4 ports | 32 | Not applicable | Not applicable | Not applicable | 12.8 | 12.5 |

Results Table-2: Relative Area Summary

The synthesis results obtained using a logic synthesis system are tabulated below in Table 3. Discrete solution refers to RSFEC decoder supporting only one mode and one channel operation.

| Multi port options | Discrete solution Area | Multiport solution area | Area Savings | Multiport solution area in terms of Discrete solution |
|---|---|---|---|---|
| 2 port configuration with 2 instances of 8S interface supporting RS(544, 514) mode, 2 instances of 8S interface supporting RS(528, 514) mode, 1 instances of 16S interface supporting RS(544, 514) mode, 1 instances of 16S interface supporting RS(528, 514) mode, | 1 | 0.57115 | 0.42885 | 57.115 |
| 4 port configuration with 4 instances of 8S interface supporting RS(544, 514) mode, 4 instances of 8S interface supporting RS(528, 514) mode, 2 instances of 16S interface supporting RS(544, 514) mode, 2 instances of 16S interface supporting RS(528, 514) mode, 1 instance of 32S interface supporting RS(544, 514) mode, 1 instance of 32S interface supporting RS(528, 514) mode, | 1 | 0.42902 | 0.57098 | 42.9021 |
| 4 port with input/output packing/unpacking logic Instance0-8S mode Instance1-8S mode Instance2-16S mode (Packing delay of 1 symbol)) Instance3-32S mode (Packing delay of 1 or 3 symbols)) | 1 | 0.66903 | 0.33097 | 66.9029 |
| 4 port with packing logic for port-2 and port-3, Instances having dual mode capability Instance0-8S mode Instance1-8S mode Instance2-16S mode (Packing delay of 1 symbol)) Instance3-32S mode (Packing delay of 3 symbols)) | 1 | 0.61596 | 0.38404 | 61.5964 |

Results Table-3 Area comparison. The numbers refer to the relative area factors. The area of discrete solutions is taken as the reference and is assigned the value as 1 in each row.

As can be observed from the table above, embodiments result in a substantial reduction in the number of gates and thus corresponding area (footprint) of an integrated circuit. Hence, the disclosed configuration beneficially enables multi-port and multi-mode Reed Solomon forward error correction with substantially fewer gates, thereby allowing for reduced footprint, lower latency, and faster through put.

By way of example, in Ethernet switch configuration, the multiport RS FEC architecture as disclosed herein provides more than 60% area savings compared to discrete solutions. The architecture can be extended to support higher number of ports as well and thereby further reduction of area can be achieved. In Ethernet switches where the number of ports can be as high as 128, the area reduction can be very significant if the proposed multiport architecture is adopted.

The disclosed configuration may be instantiated through an electronic design automation process (EDA) that allows for design and manufacturing of integrated circuit chips. For example, an integrated circuit chip or portion thereof corresponding to the structure of FIG. 1 may be designed through an EDA process. FIG. 10 illustrates an example set of processes 1100 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1110 with information supplied by a designer, information which is transformed to create an article of manufacture that uses a set of EDA processes 1112. When the design is finalized, the design is taped-out 1134, which is when artwork (e.g., geometric patterns) for the integrated circuit is sent to a fabrication facility to manufacture the mask set, which is then used to manufacture the integrated circuit. After tape-out, a semiconductor die is fabricated 1136 and packaging and assembly processes 1138 are performed to produce the finished integrated circuit 1140.

Figure 11:
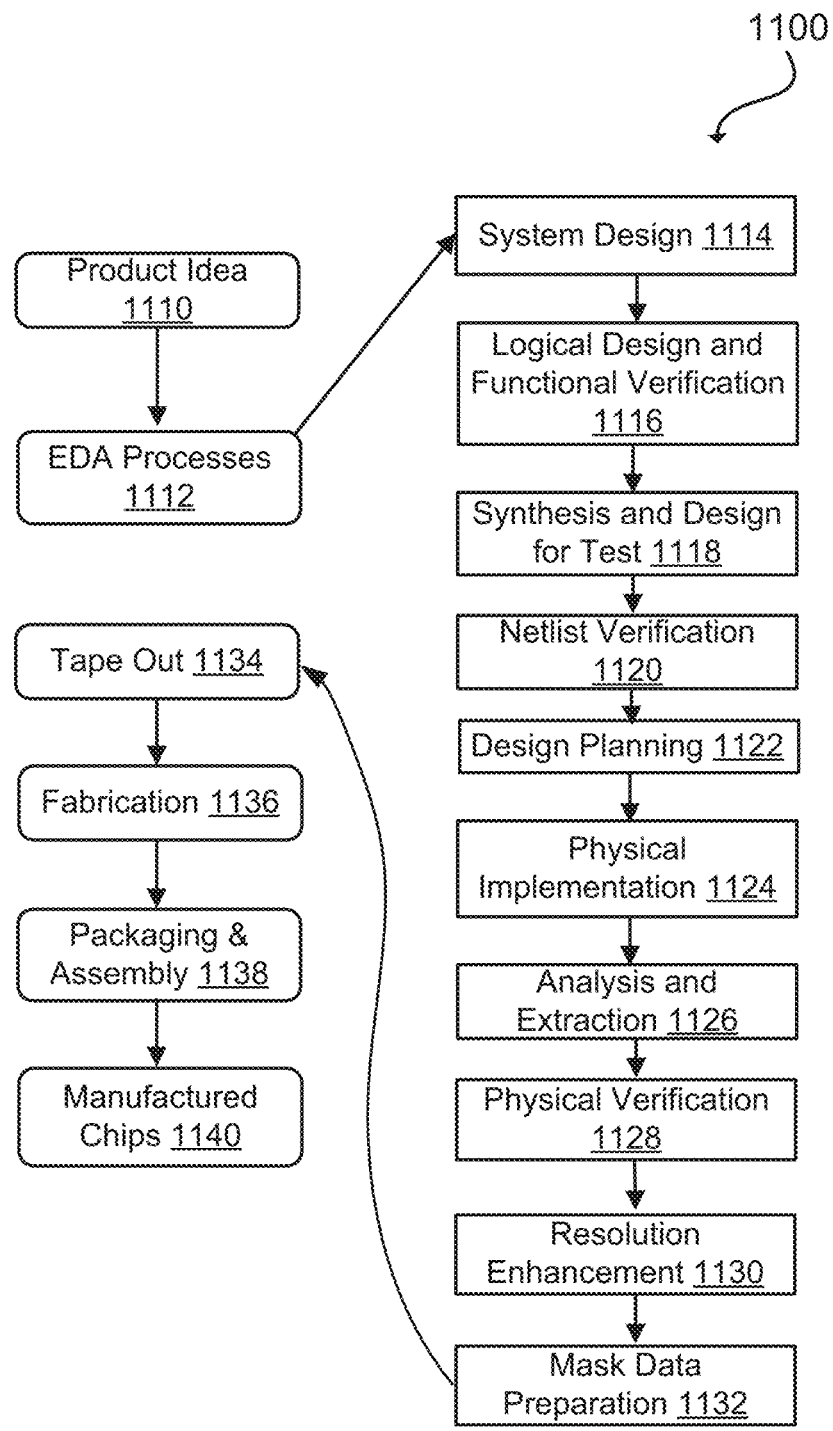
FIG. 11 depicts a flowchart of various processes used during the design and manufacture of an integrated circuit in accordance with some embodiments.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 11. The processes described by be enabled by EDA products (or tools).

During system design 1114, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1116, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1118, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1120, the netlist is checked for compliance with timing constraints and for correspondence with the HDL code. During design planning 1122, an overall floor plan for the integrated circuit is constructed and analyzed for timing and top-level routing.

During layout or physical implementation 1124, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1126, the circuit function is verified at the layout level, which permits refinement of the layout design. During physical verification 1128, the layout design is checked to ensure that manufacturing constraints are correct, such as DRC constraints, electrical constraints, lithographic constraints, and that circuitry function matches the HDL design specification. During resolution enhancement 1130, the geometry of the layout is transformed to improve how the circuit design is manufactured.

During tape-out, data is created to be used (after lithographic enhancements are applied if appropriate) for production of lithography masks. During mask data preparation 1132, the 'tape-out' data is used to produce lithography masks that are used to produce finished integrated circuits.

A storage subsystem of a computer system (such as computer system 1300 of FIG. 13, or host system 1207 of FIG. 12) may be used to store the programs and data structures that are used by some or all of the EDA products described herein, and products used for development of cells for the library and for physical and logical design that use the library.

Figure 12:
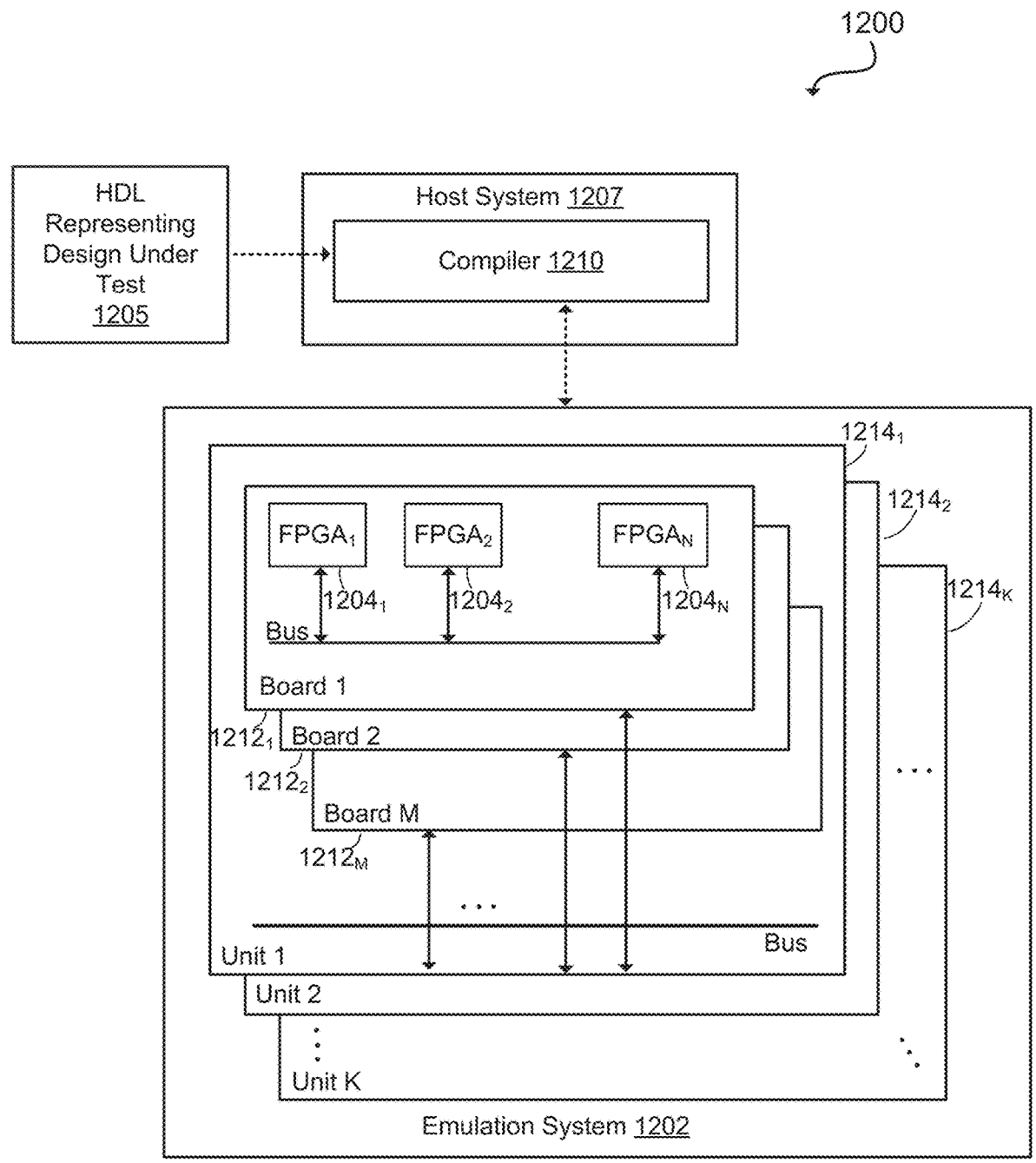
FIG. 12 depicts an abstract diagram of an example emulation system in accordance with some embodiments.

The instantiated design of the disclosed configuration may be tested through and/or applied in an emulation system. For example, a design of a chip or portion thereof as described in FIG. 1 may be emulated in an emulation system. Within an emulation system it may help reduce the number of FPGA gates needed. FIG. 12 depicts an abstract diagram of an example emulation environment 1200. An emulation environment 1200 may be configured to verify the functionality of the circuit design. The emulation environment 1200 may include a host system 1207 (e.g., a computer that is part of an EDA system) and an emulation system 1202 (e.g., a set of programmable devices such as Field Programmable Gate Arrays (FPGAs) or processors). The host system generates data and information by using a compiler 1210 to structure the emulation system to emulate a circuit design. A circuit design to be emulated is also referred to as a Design Under Test ('DUT') where data and information from the emulation are used to verify the functionality of the DUT.

The host system 1207 may include one or more processors. In the embodiment where the host system includes multiple processors, the functions described herein as being performed by the host system can be distributed among the multiple processors. The host system 1207 may include a compiler 1210 to transform specifications written in a description language that represents a DUT and to produce data (e.g., binary data) and information that is used to structure the emulation system 1202 to emulate the DUT.

The compiler 1210 can transform, change, restructure, add new functions to, and/or control the timing of the DUT.

The host system 1207 and emulation system 1202 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 1202.11. The host system 1207 and emulation system 1202 can exchange data and information through a third device such as a network server.

The emulation system 1202 includes multiple FPGAs (or other modules) such as FPGAs $1204_1$ and $1204_2$ as well as additional FPGAs to $1204_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 1202 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $1204_1$-$1204_N$ may be placed onto one or more boards $1212_1$ and $1212_2$ as well as additional boards through $1212_M$. Multiple boards can be placed into an emulation unit $1214_1$. The boards within an emulation unit can be connected using the backplane of the emulation unit or any other types of connections. In addition, multiple emulation units (e.g., $1214_1$ and $1214_2$ through $1214_K$) can be connected to each other by cables or any other means to form a multi-emulation unit system.

For a DUT that is to be emulated, the host system 1207 transmits one or more bit files to the emulation system 1202. The bit files may specify a description of the DUT and may further specify partitions of the DUT created by the host system 1207 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 1207 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 1207 and/or the compiler 1210 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 1205 into gate level logic. For a DUT that is to be emulated, the design synthesizer sub-system receives a description of the DUT. If the description of the DUT is fully or partially in HDL (e.g., RTL or other level of abstraction), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 13:
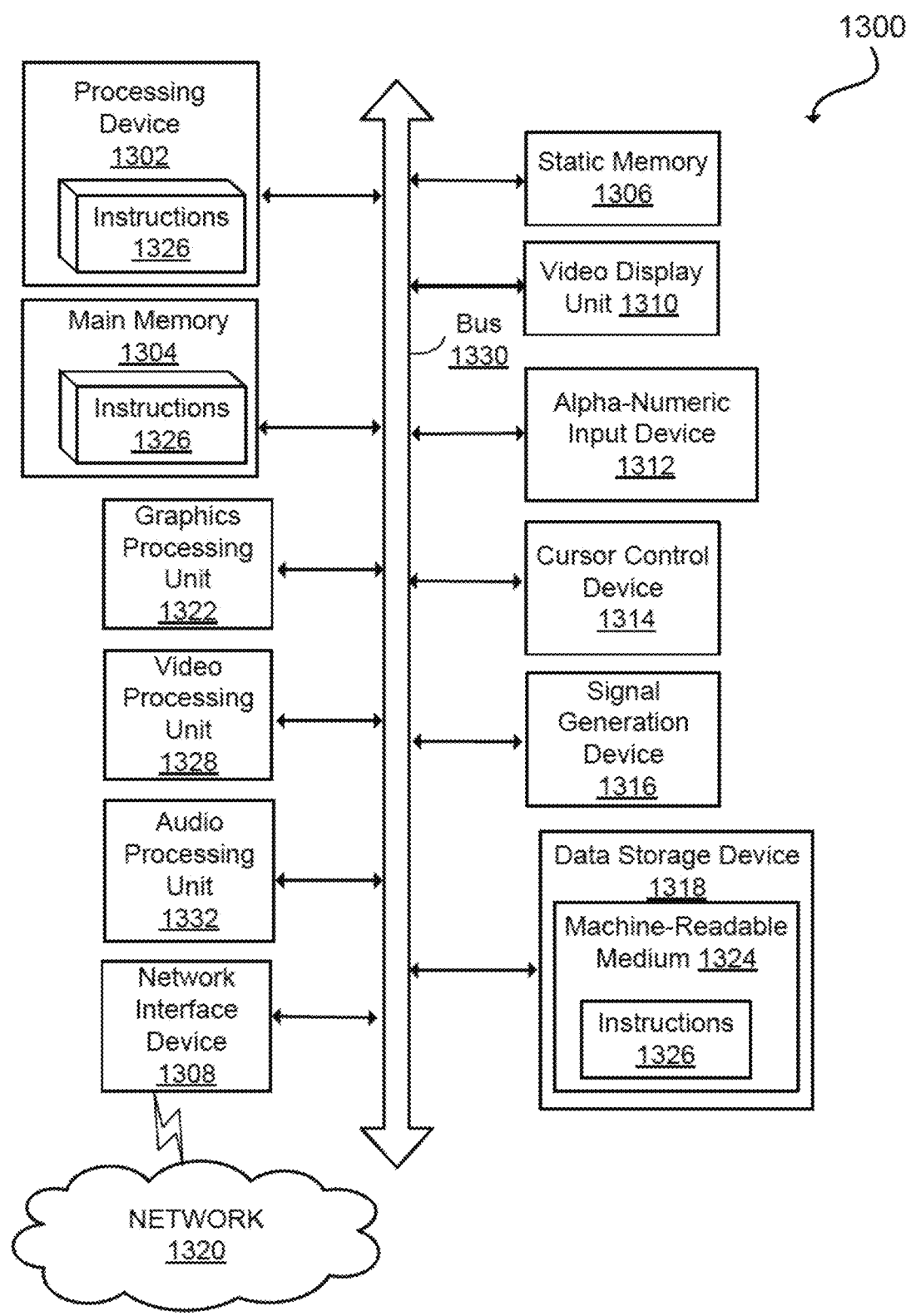
FIG. 13 depicts a diagram of an example computer system in which embodiments may operate.

FIG. 13 illustrates an example machine of a computer system 1300 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1300 includes a processing device 1302, a main memory 1304 (e.g., read-only memory (ROM), flash memory, dynamic random access memory (DRAM) such as synchronous DRAM (SDRAM), a static memory 1306 (e.g., flash memory, static random access memory (SRAM), etc.), and a data storage device 1312, which communicate with each other via a bus 1330.

Processing device 1302 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1302 may also be one or more special-purpose processing devices such as an application specific integrated circuit (ASIC), a field programmable gate array (FPGA), a digital signal processor (DSP), network processor, or the like. The processing device 1302 may be configured to execute instructions 1326 for performing the operations and steps described herein.

The computer system 1300 may further include a network interface device 1308 to communicate over the network 1320. The computer system 1300 also may include a video display unit 1310 (e.g., a liquid crystal display (LCD) or a cathode ray tube (CRT)), an alphanumeric input device 1312 (e.g., a keyboard), a cursor control device 1314 (e.g., a mouse), a graphics processing unit 1322, a signal generation device 1316 (e.g., a speaker), graphics processing unit 1322, video processing unit 1328, and audio processing unit 1332.

The data storage device 1318 may include a machine-readable storage medium 1324 (also known as a non-transitory computer-readable medium) on which is stored one or more sets of instructions 1326 or software embodying any one or more of the methodologies or functions described herein. The instructions 1326 may also reside, completely or at least partially, within the main memory 1304 and/or within the processing device 1302 during execution thereof by the computer system 1300, the main memory 1304 and the processing device 1302 also constituting machine-readable storage media.

In some implementations, the instructions 1326 include instructions to implement functionality corresponding to the present disclosure. While the machine-readable storage medium 1324 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1302 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A multi-port, multi-mode Reed Solomon (RS) forward error correction system comprising:
    a plurality of data ports each receiving a respective data in line;
    a syndrome block (SDM) comprising a plurality of syndrome slices and a SDM switching logic, an input of a SDM slice coupled with the respective data in line, the SDM switching logic coupled with an interface port width (IFW) line and a mode line, wherein the SDM switching logic associates different slices to a particular port based on data received by IFW line for sharing available slices among multiple ports and mode line performs mode selection by identifying an RS mode;
    a reformulated inversionless Berlekamp-Massey (RiBM) block comprising a plurality of RiBM slices and a RiBM switching logic, an RiBM slice coupled with an output of a corresponding SDM slice, the RiBM switching logic coupled with the IFW line and the mode line;
    a Chien Forney (ChFr) block having a plurality of ChFr slices, a ChFr slice coupled with an output of a corresponding RiBM slice, each ChFr slice coupled with the IFW line and the mode line;
    an error evaluation magnitude (ErEval) block having a plurality of ErEval slices, each ErEval slice coupled with an output of a corresponding ChFr slice; and
    a plurality of adders, an adder coupled with an output of a corresponding ErEval slice and a corresponding memory from a plurality of memories coupled with the data in line from the plurality of data in lines coupled with the corresponding SDM slice, the adder identifying an error location in the data, applying a fix to the data, and outputting the data on a data out line.

2. The system of claim 1, further comprising a memory interface to couple with the plurality of data ports and to couple to the plurality of memories, a data in line associated with the corresponding memory.

3. The system of claim 1, wherein the Reed Solomon forward error correction mode is one of a RS (544,514) interleaved code word, RS(544,514) normal mode, a RS (528,514) code word, and a RS (272,258) code word.

4. The system of claim 3, wherein data to be decoded on the data in line passed through to a data out line responsive to the SDM slice determining no error in the data.

5. The system of claim 1 wherein a software control system groups the plurality of data input lines.

6. A forward error correction (FEC) method in a multi-port, multi-mode system, the method comprising:
    receiving at a syndrome (SDM) slice within a SDM block data to be decoded, a first signal corresponding to a port width, a second signal corresponding to Reed Solomon (RS) FEC mode, the port width providing information a port with the data to be decoded and the RS FEC mode providing a code word, the SDM slice determining whether there is an error in the received data to be decoded by outputting a non-zero value signal in response to a determined error, each SDM slice generating an SDM slice output; and
    processing the SDM slice outputs by a switching logic, the switching logic comprising one or more adders and one or more multiplexers, the processing comprising:
        receiving by the one or more adders, SDM slice outputs as inputs to combine the received SDM slice outputs into combined SDM slice outputs; and
        receiving by the one or more multiplexers, an IFW signal and the combined SDM slice outputs as inputs to select one or more combined SDM slice outputs based on the value of the IFW signal, the selected one or more combined SDM slice outputs provided as inputs to a reformulated inversionless Berlekamp-Massey (RiBM) block.

7. The method of claim 6, wherein the RiBM block comprises one or more RiBM slices, the method further comprising:
    receiving at each RiBM slice in an RiBM block the combined SDM slice output to generate an error location based on the code word by outputting an error locator polynomial signal and an error evaluator polynomial signal.

8. The method of claim 7, further comprising:
    receiving at a Chien-Forney (ChFr) slice in a ChFr block the error locator polynomial signal and the error evaluator polynomial signal, the ChFr slice determining where the errors are in the data and information for a magnitude of the error by outputting a numerator and a denominator.

9. The method of claim 8, further comprising:
receiving at an error evaluation slice of an error evaluator block, the numerator and denominator, the error evaluation slice determining the magnitude of an error and outputting the magnitude of the error.

10. The method of claim 9, further comprising:
receiving at an adder the magnitude of the error for the data and the data from a memory to fix the error in the data and output a corrected data.

11. A non-transitory computer readable storage medium storing a digital representation of a multi-port, multi-mode Reed Solomon (RS) forward error correction system, the system comprising:
a plurality of data in lines, a data in line associated with a data port;
a syndrome block (SDM) comprising a plurality of syndrome slices and a SDM switching logic, an input of a SDM slice coupled with a data in line from the plurality of data in lines, the SDM switching logic coupled with an interface port width (IFW) line a mode line, the IFW line to identify a number of data in lines tied together and the mode line to identify a RS mode, each SDM slice outputting an SDM slice output signal, the switching logic comprising:
one or more adders, each of the adders configured to combine SDM slice outputs to generate combinations of SDM slice outputs;
one or more multiplexers, each multiplexer configured to receive an IFW signal and select a combination of the SDM slice outputs based on the value of the IFW signal, the combinations of the SDM slice output provided as input to a reformulated inversionless Berlekamp-Massey (RiBM) block.

12. The non-transitory computer readable storage medium of claim 11, further comprising the RiBM block comprising a plurality of RiBM slices, each RiBM slice coupled with an output of a corresponding SDM slice.

13. The non-transitory computer readable storage medium of claim 12, further comprising a Chien Forney (ChFr) block having a plurality of ChFr slices, each ChFr slice coupled with an output of a corresponding RiBM slice, each ChFr slice coupled with the IFW line and the mode line.

14. The non-transitory computer readable storage medium of claim 13, further comprising an error evaluation magnitude (ErEval) block having a plurality of ErEval slices, each ErEval slice coupled with an output of a corresponding ChFr slice.

15. The non-transitory computer readable storage medium of claim 13, further comprising a plurality of adders, an adder coupled with an output of a corresponding ErEval slice, the adder identifying an error location in the data, applying a fix to the data, and outputting the data on a data out line.

16. The non-transitory computer readable storage medium of claim 11, further comprising a memory interface to couple with the plurality of data and to couple to a plurality of memories, a data in line associated with a corresponding memory.

17. The non-transitory computer readable storage medium of claim 11, wherein the Reed Solomon forward error correction mode is one of a RS (544,514) interleaved code word, RS(544,514) normal mode, a RS (528,514) code word, and a RS (272,258) code word.

18. The non-transitory computer readable storage medium of claim 13, wherein data to be decoded on the data in line passed through to a data out line responsive to the SDM slice determining no error in the data.

19. The non-transitory computer readable storage medium of claim 11 wherein a software control system groups the plurality of data input lines.

* * * * *